US012735789B2

(12) United States Patent
Huang et al.

(10) Patent No.: US 12,735,789 B2
(45) Date of Patent: Sep. 15, 2026

(54) POCKET HEATER WITH PURGE TO IMPROVE GAP TOLERANCE

(71) Applicant: Applied Materials, Inc., Santa Clara, CA (US)

(72) Inventors: Zubin Huang, Santa Clara, CA (US); Tomoharu Matsushita, Kamagaya (JP); Cheng-Hsiung Tsai, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1025 days.

(21) Appl. No.: 17/751,273

(22) Filed: May 23, 2022

(65) Prior Publication Data

US 2023/0265561 A1 Aug. 24, 2023

Related U.S. Application Data

(60) Provisional application No. 63/312,523, filed on Feb. 22, 2022.

(51) Int. Cl.

| | |
|---|---|
| ***C23C 16/458*** | (2006.01) |
| ***C23C 16/46*** | (2006.01) |
| ***H10P 72/76*** | (2026.01) |

(52) U.S. Cl.

CPC .......... *C23C 16/4585* (2013.01); *C23C 16/46* (2013.01); *H10P 72/7606* (2026.01)

(58) Field of Classification Search

USPC ... 118/500, 501, 715, 728, 729, 52, 612, 58, 118/62, 63

See application file for complete search history.

(56) References Cited

U.S. PATENT DOCUMENTS

| | | | |
|---|---|---|---|
| 5,238,499 A | 8/1993 | van de Ven et al. | |
| 5,516,367 A | 5/1996 | Lei et al. | |
| 5,800,686 A | 9/1998 | Littau et al. | |
| 5,882,417 A | 3/1999 | van de Ven et al. | |
| 2003/0051665 A1 | 3/2003 | Zhao et al. | |
| 2003/0071032 A1 * | 4/2003 | Yamaguchi ....... | H01L 21/67103 219/484 |
| 2006/0011611 A1 | 1/2006 | Goto et al. | |

(Continued)

FOREIGN PATENT DOCUMENTS

| | | |
|---|---|---|
| EP | 1167573 A1 | 1/2002 |
| KR | 10-2014-0099158 A | 8/2014 |

OTHER PUBLICATIONS

International Search Report and Written Opinion dated Apr. 24, 2023 for Application No. PCT/US2022/052074.

(Continued)

*Primary Examiner* — Yewebdar T Tadesse

(74) *Attorney, Agent, or Firm* — Patterson + Sheridan, LLP

(57) ABSTRACT

A substrate support includes a monolithic body. The monolithic body includes a central portion and a peripheral portion. The central portion includes a top surface recessed with respect to the peripheral portion. A shadow ring is configured to sit directly upon an upper surface of the peripheral portion, and overlaps a portion of a substrate positioned upon the central portion. A heating element embedded within the central portion heats the central portion, the peripheral portion, and the shadow ring.

20 Claims, 4 Drawing Sheets

(56) References Cited

U.S. PATENT DOCUMENTS

| | | | | |
|---|---|---|---|---|
| 2009/0314433 | A1* | 12/2009 | Hoffman | H01L 21/6833<br>156/345.48 |
| 2015/0270155 | A1 | 9/2015 | Hochstetler et al. | |
| 2017/0040198 | A1 | 2/2017 | Lin et al. | |
| 2020/0176296 | A1 | 6/2020 | Khaja et al. | |
| 2023/0128390 | A1* | 4/2023 | Huang | C23C 16/45591<br>414/217 |

OTHER PUBLICATIONS

Office Action from Taiwanese Patent Application No. 111148437, dated May 29, 2026.

* cited by examiner

POCKET HEATER WITH PURGE TO IMPROVE GAP TOLERANCE

CROSS-REFERENCE TO RELATED APPLICATIONS

This application claims priority to U.S. provisional patent application Ser. No. 63/312,523; filed on Feb. 22, 2022; which is herein incorporated by reference in its entirety.

BACKGROUND

Field

Embodiments of the present disclosure generally relate to substrate processing including semiconductor substrate processing.

Description of the Related Art

Semiconductor substrates are processed for a wide variety of applications, including the fabrication of integrated devices and microdevices. During processing, the substrate is positioned on a substrate support within a processing chamber. In some processes, the substrate is heated by a heater embedded in the substrate support. The interior of the processing chamber is placed under vacuum while the substrate is processed by exposure to heat and process gases. In some processes, such as chemical vapor deposition (CVD) processes, the deposition of substances at the edge of a substrate leads to flaking of the deposited layers, which adversely impacts the product yield from a substrate.

Thus, there is a need for improved apparatus that facilitates the processing of substrates.

SUMMARY

The present disclosure generally relates to substrate processing, and particularly to apparatus and systems that mitigate detrimental deposition of substances at the edges of substrates.

In one embodiment, a substrate support includes a monolithic body including a central portion and a peripheral portion. The central portion includes a top surface recessed with respect to the peripheral portion, and further includes a heating element.

In one embodiment, a substrate support includes a monolithic body including a central portion and a peripheral portion. The central portion includes a top surface recessed with respect to the peripheral portion, and further includes a heating element. A shadow ring is positioned directly upon an upper surface of the peripheral portion.

In one embodiment, a processing chamber includes a chamber body and a substrate support enclosed in a processing volume within the chamber body. The substrate support includes a monolithic body including a central portion and a peripheral portion. The central portion includes a top surface recessed with respect to the peripheral portion, and further includes a heating element. A shadow ring is positioned directly upon an upper surface of the peripheral portion.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
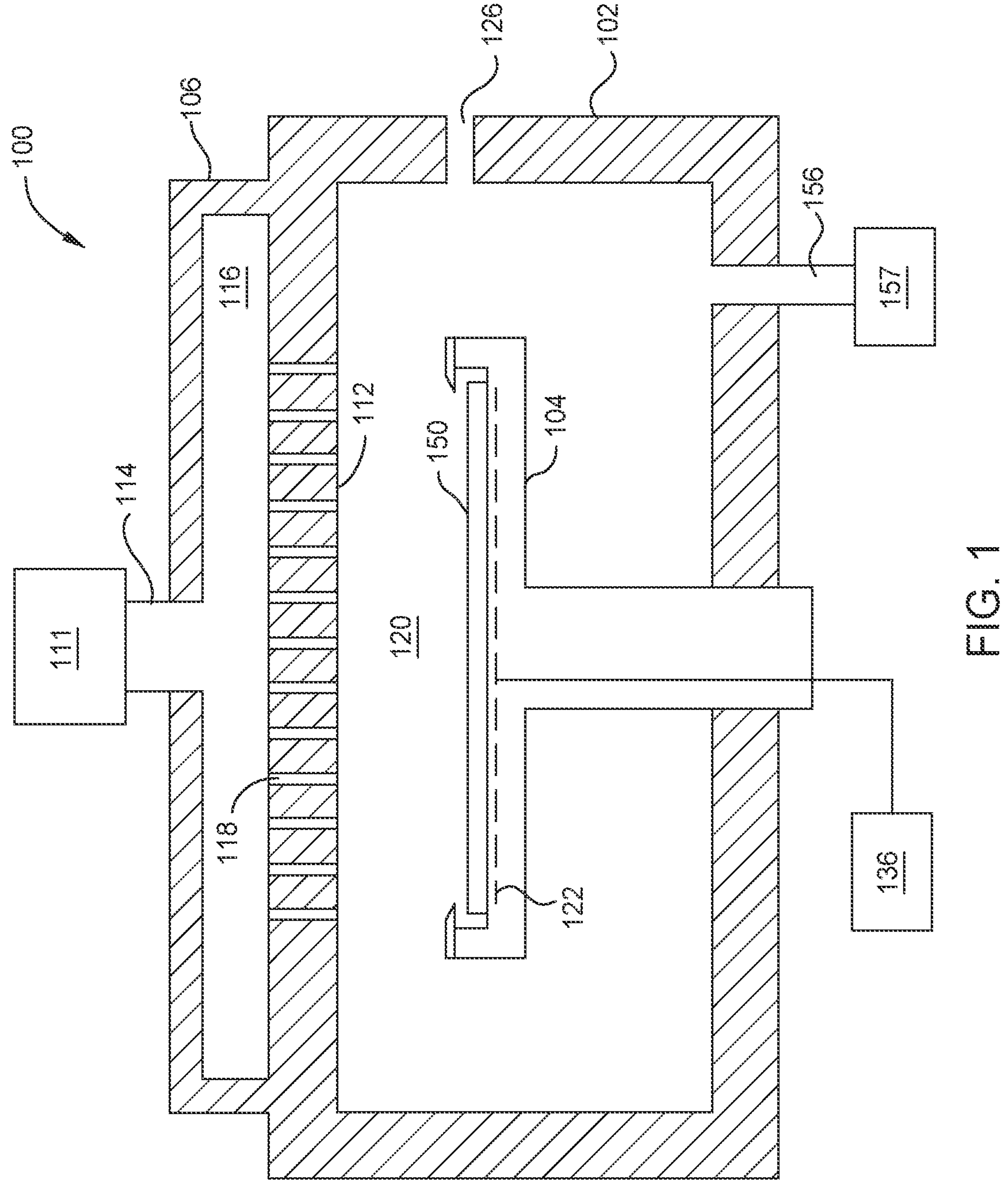
FIG. 1 is a schematic cross-sectional view of a processing chamber.

The present disclosure concerns substrate processing and components for chambers used in substrate processing. FIG. 1 illustrates a schematic cross-sectional view of a processing chamber 100. As illustrated, the processing chamber 100 is configured as a CVD chamber, although in some embodiments, processing chamber 100 may be configured to perform another processing operation, such as a processing operation that involves plasma. The processing chamber 100 features a chamber body 102, a substrate support 104 disposed inside the chamber body 102, and a lid 106 coupled to the chamber body 102, and enclosing the substrate support 104 in a processing volume 120. The substrate support 104 is configured to support a substrate 150 thereon during processing. As illustrated, a heating element 122 is embedded within the substrate support 104. The heating element 122 is coupled to a power source 136. The substrate 150 is provided to the processing volume 120 through an opening 126.

The substrate support 104 contains, or is formed from, one or more metallic or ceramic materials. Exemplary metallic or ceramic materials include one or more metals, metal oxides, metal nitrides, metal oxynitrides, or any combination thereof. For example, the substrate support 104 may contain or be formed from aluminum, aluminum oxide, aluminum nitride, aluminum oxynitride, or any combination thereof.

An exhaust port 156 is coupled to a vacuum pump 157. The vacuum pump 157 removes excess process gases or by-products from the processing volume 120 via the exhaust port 156 during and/or after processing.

A gas supply source 111 includes one or more gas sources. The gas supply source 111 is configured to deliver the one or more gases from the one or more gas sources to the processing volume 120. Each of the one or more gas sources provides a processing gas (such as argon, hydrogen or helium). In some embodiments, one or more of a carrier gas and an ionizable gas may be provided into the processing volume 120 along with one or more precursors. When processing a 300 mm substrate, the processing gases are introduced to the processing chamber 100 at a flow rate from about 6500 sccm to about 8000 sccm, from about 100 sccm to about 10,000 sccm, or from about 100 sccm to about 1000 sccm. Alternatively, other flow rates may be utilized. In some examples, a remote plasma source can be used to deliver plasma to the processing chamber 100 and can be coupled to the gas supply source 111.

The showerhead 112 features openings 118 for admitting process gas or gases into the processing volume 120 from the gas supply source 111. The process gases are supplied to the processing chamber 100 via a gas feed 114, and the process gases enter a plenum 116 prior to flowing through the openings 118. In some embodiments, different process gases that are flowed simultaneously during a processing operation enter the processing chamber 100 via separate gas feeds and separate plenums prior to entering the processing volume 120 through the showerhead 112.

Figure 2:
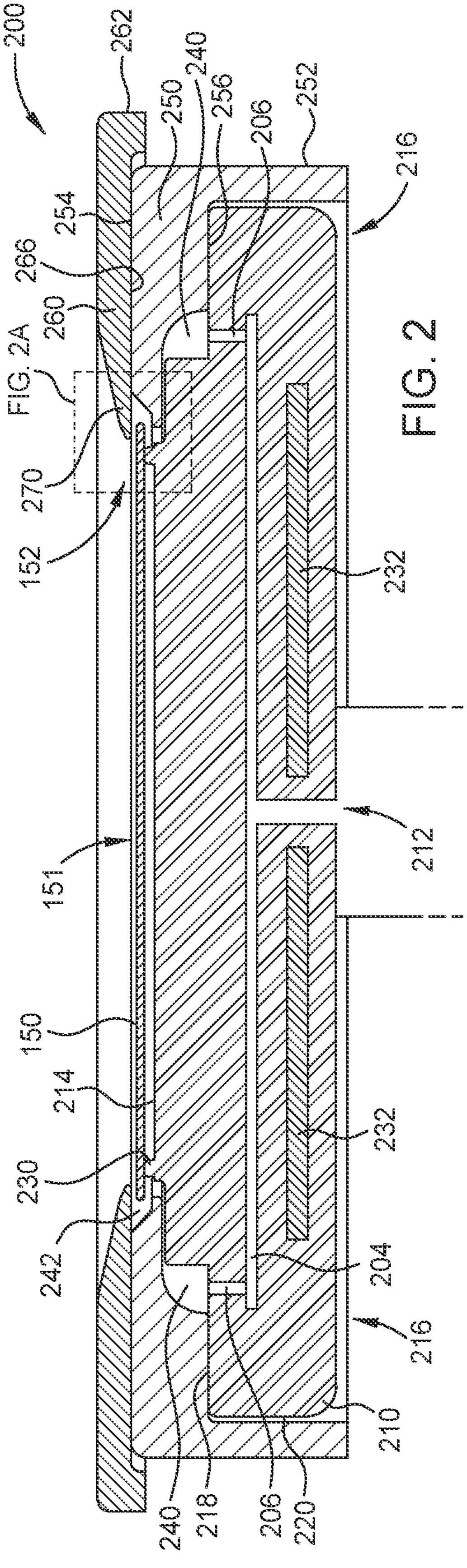
FIG. 2 is a schematic cross-sectional view of a substrate support.
Figure 2A:
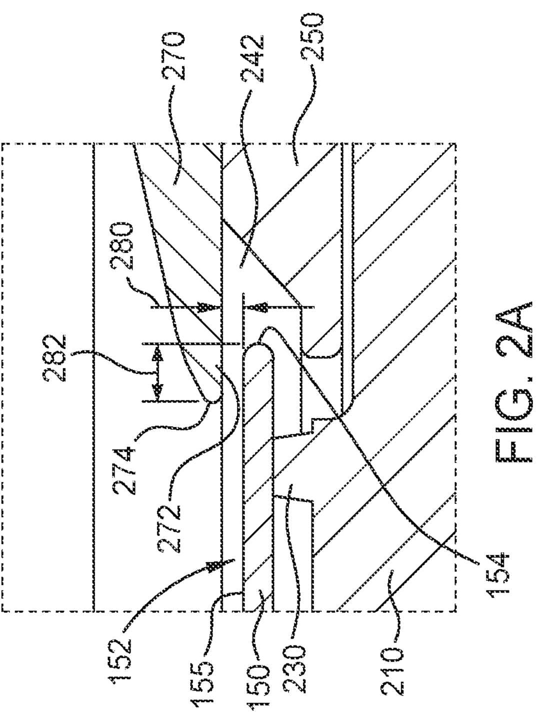
FIG. 2A is an enlargement of a portion of FIG. 2.

FIG. 2 is a schematic cross-sectional view of a substrate support 200, and FIG. 2A is an enlargement of a portion of FIG. 2. It is contemplated that substrate support 200 can be used as substrate support 104 in processing chamber 100. Substrate support 200 includes a body 210 with a central portion 212 configured to receive a substrate 150 and which is elevated with respect to a peripheral portion 216. A top surface 214 of the central portion 212 includes a raised band 230. The substrate 150 sits on the raised band 230, which facilitates the application of a vacuum to the substrate 150 in order to secure the substrate 150 to the body 210. One or more heating elements 232 are embedded in the central portion 212. It is contemplated that heating elements 232 can be used as heating element 122 in processing chamber 100. The heating elements 232 heat the body 210, which heats the substrate 150 when the substrate 150 undergoes processing. In some embodiments, the body 210 is made from a ceramic material, such as aluminum nitride.

One or more channels 204 convey a purge gas through the body 210. The purge gas exits the one or more channels 204 via one or more ports 206. The ports 206 open into a primary pocket 240 formed between the peripheral portion 216 and a purge ring 250. The purge ring 250 is an annular member that sits upon an upper surface 218 of the peripheral portion 216. The purge ring 250 can be removed and replaced by another purge ring of a different configuration. In some embodiments, the purge ring 250 is made from a ceramic material, such as aluminum oxide or aluminum nitride. The purge ring 250 includes a skirt 252 that encompasses an outer wall 220 of the peripheral portion 216. In some embodiments, the purge ring 250 is centered on the body 210. In some embodiments, centering of the purge ring 250 on the body 210 is facilitated by engagement of one or more protrusions with corresponding receptacle(s). In an example, one or more protrusions on the upper surface 218 of the peripheral portion 216 engage corresponding receptacle(s) in a lower surface 256 of the purge ring 250. In another example, one or more protrusions on the lower surface 256 of the purge ring 250 engage corresponding receptacle(s) in the upper surface 218 of the peripheral portion 216.

When the substrate 150 is being processed, a shadow ring 260 sits on an upper surface 254 of the purge ring 250. The shadow ring 260 is removable from the upper surface 254 of the purge ring 250 in order to facilitate placement and removal of the substrate 150 onto, and from, the raised band 230. In some embodiments, the shadow ring 260 is made from a ceramic material, such as aluminum oxide or aluminum nitride. The shadow ring 260 is an annular member, and includes a flange 262 that encompasses at least a portion of the skirt 252 of the purge ring 250. In some embodiments, the shadow ring 260 is centered on the purge ring 250. In some embodiments, centering of the shadow ring 260 on the purge ring 250 is facilitated by engagement of one or more protrusions with corresponding receptacle(s). In an example, one or more protrusions on the upper surface 254 of the purge ring 250 engage corresponding receptacle(s) in a lower surface 266 of the shadow ring 260. In another example, one or more protrusions on the lower surface 266 of the shadow ring 260 engage corresponding receptacle(s) in the upper surface 254 of the purge ring 250.

The shadow ring 260 extends radially inwardly, and includes a lip 270. The shadow ring 260 is sized such that the lip 270 is positioned above the edge 154 of the substrate 150 when the substrate 150 is positioned on the raised band 230 of the body 210. In some embodiments, there exists a vertical separation 280 between a bottom surface 272 of the lip 270 and a top surface 155 of the substrate 150. For example, the vertical separation 280 may be 0.001" to 0.02" (0.0254 mm to 0.508 mm), such as 0.002" to 0.015" (0.0508 mm to 0.381 mm), such as 0.005" to 0.015" (0.127 mm to 0.381 mm), such as 0.007" to 0.012" (0.1778 mm to 0.3048 mm).

In some embodiments, when the substrate 150 is positioned on the raised band 230 of the body 210, and the shadow ring 260 is positioned on the purge ring 250, the lip 270 overlaps the substrate 150 such that there exists a lateral distance 282 between the inner edge 274 of the lip 270 and the edge 154 of the substrate 150. For example, the lateral distance 282 between the inner edge 274 of the lip 270 and the edge 154 of the substrate 150 may be 0.001" to 0.1" (0.0254 mm to 2.54 mm), such as 0.02" to 0.09" (0.508 mm to 2.286 mm), such as 0.04" to 0.08" (1.016 mm to 2.032 mm), such as 0.05" to 0.07" (1.27 mm to 1.778 mm). In some embodiments, when the substrate 150 is positioned on the raised band 230 of the body 210, and the shadow ring 260 is positioned on the purge ring 250, the lateral distance 282 between the inner edge 274 of the lip 270 and the edge 154 of the substrate 150 is zero. In some embodiments, when the substrate 150 is positioned on the raised band 230 of the body 210, and the shadow ring 260 is positioned on the purge ring 250, the lip 270 does not overlap the substrate 150.

The purge ring 250 and the lip 270 of the shadow ring 260 form a secondary pocket 242. When the substrate 150 is being processed, purge gas flows between the purge ring 250 and the body 210 from the primary pocket 240 into the secondary pocket 242. The shadow ring 260 and the purge ring 250 then direct the purge gas from the secondary pocket 242 toward and around the edge 154 of the substrate. The flow of purge gas around the edge 154 of the substrate 150 counteracts the tendency of constituents of process gases to migrate toward, and become deposited upon, the edge 154 of the substrate 150.

The effectiveness of the purge gas at mitigating such edge deposition depends at least in part upon the vertical separation 280 of the bottom surface 272 of the lip 270 from the top surface 155 of the substrate 150. If the vertical separation 280 is relatively small, a velocity of the purge gas between the substrate 150 and the lip 270 is relatively high, and the purge gas can effectively counteract migration of process gas constituents toward the edge 154 of the substrate 150.

If the vertical separation 280 is relatively large, the velocity of the purge gas between the substrate 150 and the lip 270 is relatively low, and the purge gas may not effectively counteract migration of process gas constituents toward the edge 154 of the substrate 150.

The vertical separation 280 of the bottom surface 272 of the lip 270 from the top surface 155 of the substrate 150 is determined at least in part by the dimensional tolerances of the components. In an example, dimensional tolerances apply to: (i) the vertical stack up from the upper surface 218 of the peripheral portion 216 of the body 210 to the raised band 230; (ii) the vertical thickness of the purge ring 250 from the lower surface 256 to the upper surface 254; (iii) the vertical stack up from the lower surface 266 of the shadow ring 260 to the bottom surface 272 of the lip 270; and (iv) the thickness of the substrate 150. It has been found that the stack-up of such dimensional tolerances causes the magnitude of the vertical separation 280 of the bottom surface 272 of the lip 270 from the top surface 155 of the substrate 150 to vary between processing chambers incorporating substrate support 200. Thus, the yield and quality of processed substrates can vary between processing chambers incorporating substrate support 200. Consequently, the operating parameters of each processing chamber incorporating substrate support 200 are tailored to account for such variances, which adds complexity, time, and cost to procedures involving the simultaneous operation of multiple processing chambers incorporating substrate support 200.

The effectiveness of the purge gas at mitigating edge deposition depends at least in part upon the lateral distance 282 between the inner edge 274 of the lip 270 and the edge 154 of the substrate 150. If the lateral distance 282 is relatively large, there is relatively low flow conductance of the purge gas, and therefore the purge gas may not effectively counteract migration of process gas constituents toward the edge 154 of the substrate 150. If the lateral distance 282 is relatively small, there is relatively high flow conductance of the purge gas, and therefore the purge gas may effectively counteract migration of process gas constituents toward the edge 154 of the substrate 150.

Furthermore, the lateral distance 282 between the inner edge 274 of the lip 270 and the edge 154 of the substrate is at least in part dependent upon the concentricity of the shadow ring 260 and the substrate 150. If the shadow ring 260 and the substrate 150 are not concentric, then the lateral distance 282 between the inner edge 274 of the lip 270 and the edge 154 of the substrate 150 is relatively large in some areas and relatively small in other areas. Such a lack of concentricity leads to inconsistencies in the deposition of process gas constituents towards the outer regions 152 of the substrate 150.

Concentricity of the shadow ring 260 and the substrate 150 relies at least in part upon lateral positioning of the purge ring 250 with respect to the body 210 plus lateral positioning of the shadow ring 260 with respect to the purge ring 250. It has been found that the stack-up of lateral positioning tolerances causes the magnitude of the lateral distance 282 between the inner edge 274 of the lip 270 and the edge 154 of the substrate 150 to vary from processing chamber to processing chamber incorporating substrate support 200. Thus, the degree of concentricity of the shadow ring 260 and the substrate 150 varies from processing chamber to processing chamber. Hence, one processing chamber incorporating substrate support 200 may produce a processed substrate 150 that is different at outer regions 152 than a substrate 150 processed in another processing chamber incorporating substrate support 200. Therefore, the yield and quality of processed substrates 150 can vary between processing chambers incorporating substrate support 200.

Moreover, it has been found that the lip 270 of the shadow ring 260 acts as a heat sink such that heat from the portion of the substrate 150 that is overlapped by the lip 270 radiates to the lip 270. Thus, the portion of the substrate 150 that is overlapped by the lip 270 cools compared to the rest of the substrate 150. Consequently, the substrate 150 is subject to a temperature gradient from a central region 151 to the edge 154. The temperature of the substrate 150 affects the rate of deposition onto the substrate 150, and therefore the temperature gradient within the substrate 150 leads to an unwanted uneven deposition of substances onto the substrate 150.

Additionally, the radiative transfer of heat from the substrate 150 to the shadow ring 260 is enhanced by the proximity of the lip 270 to the substrate 150. Thus, when the vertical separation 280 of the bottom surface 272 of the lip 270 from the top surface 155 of the substrate 150 is relatively small, the evenness of deposition on the substrate 150 can be adversely affected.

It has been found that the propensity of the shadow ring 260 to act as a detrimental heat sink is caused at least in part by the purge ring 250 and the shadow ring 260 not being heated effectively by the heating element 232 in the body 210. Without being bound by theory, it is contemplated that inefficiencies of heat transfer at the interface between the purge ring 250 and the body 210, and the interface between the shadow ring 260 and purge ring 250, contribute to the ineffective heating of the shadow ring 260.

Additionally, ineffective heating of the purge ring 250 and the shadow ring 260 can result in cooling of the purge gas within the primary pocket 240 and within the secondary pocket 242. Thus, when the purge gas flows between the lip 270 of the shadow ring 260 and the substrate 150, the purge gas can cool the outer region 152 of the substrate 150. Such cooling can enhance the detrimental temperature gradient experienced by the substrate 150, described above.

Figure 3:
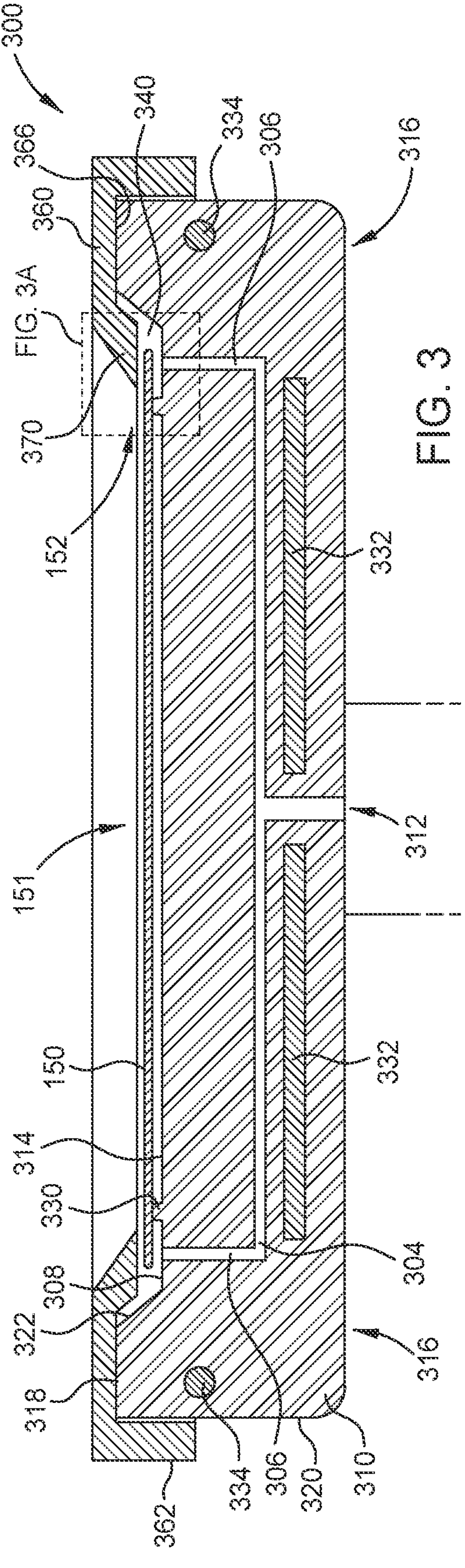
FIG. 3 is a schematic cross-sectional view of another substrate support.
Figure 3A:
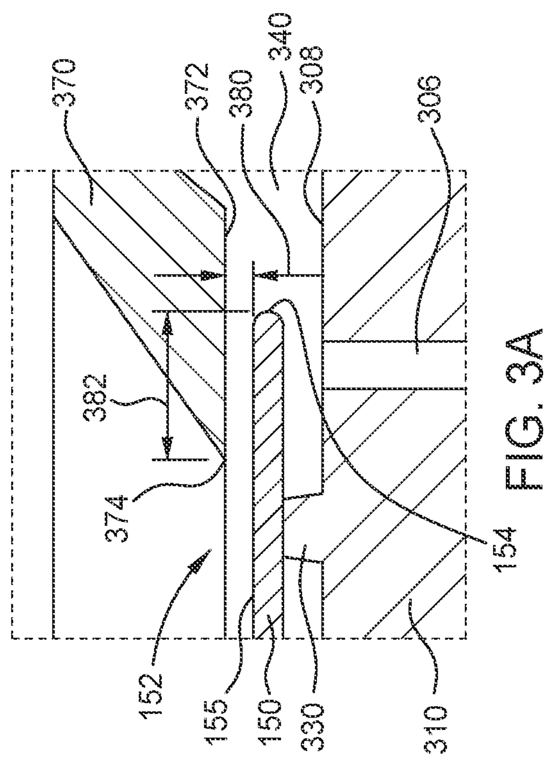
FIG. 3A is an enlargement of a portion of FIG. 3.
Figure 4:
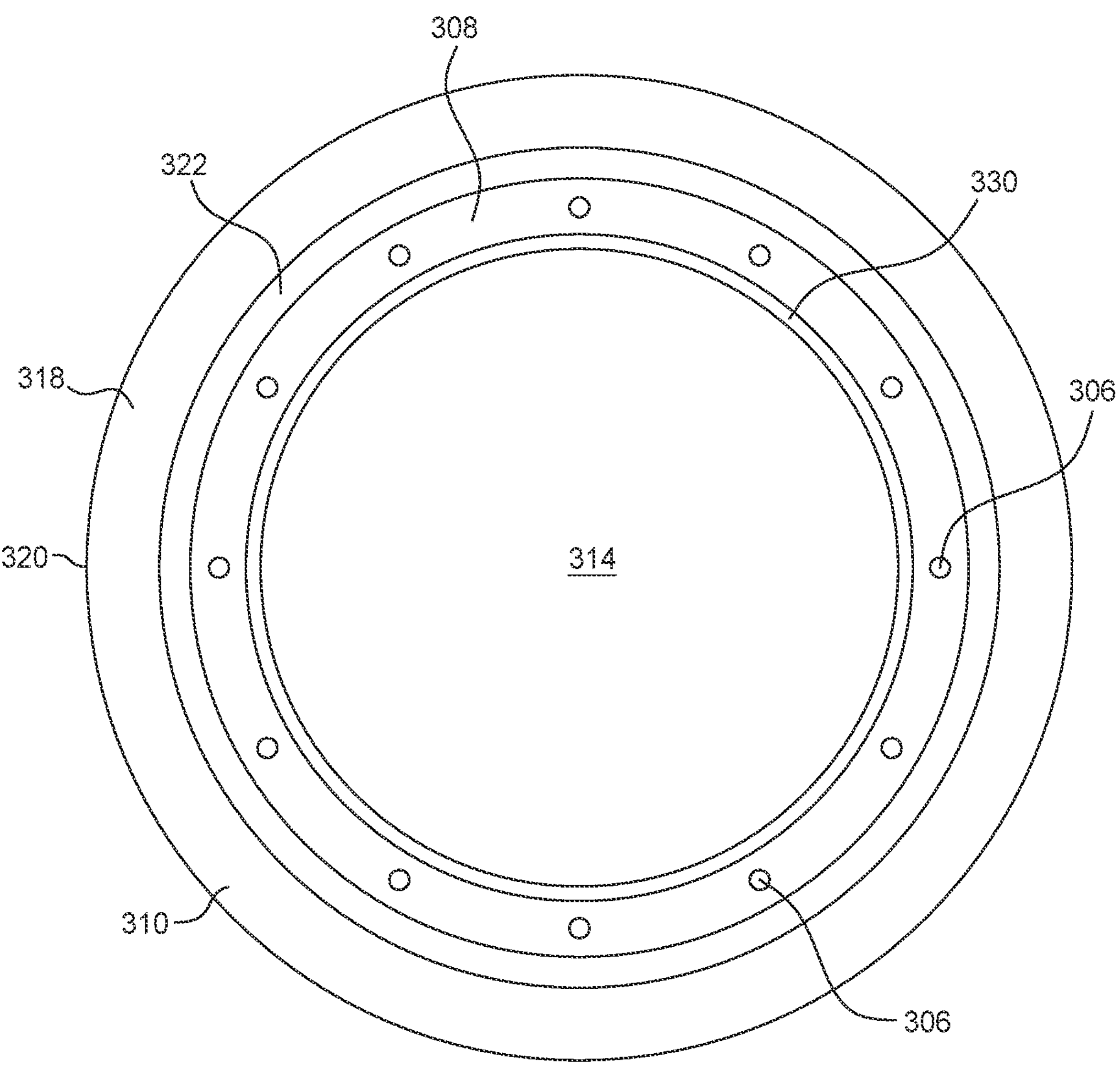
FIG. 4 is a plan view of a part of the substrate support of FIG. 3.

FIG. 3 is a schematic cross-sectional view of a substrate support 300, and FIG. 3A is an enlargement of a portion of FIG. 3. FIG. 4 is a plan view of a part of the substrate support 300 of FIG. 3. It is contemplated that substrate support 300 can be used as substrate support 104 in processing chamber 100. Substrate support 300 includes a body 310 with a central portion 312 configured to receive a substrate 150 and which is recessed with respect to a peripheral portion 316. A top surface 314 of the central portion 312 includes a raised band 330. The substrate 150 sits on the raised band 330, which facilitates the application of a vacuum to the substrate 150 in order to secure the substrate 150 to the body 310. One or more heating elements 332 are embedded in the central portion 312. It is contemplated that heating elements 332 can be used as heating element 122 in processing chamber 100. The heating elements 332 heat the body 310, which heats the substrate 150 when the substrate 150 undergoes processing. In some embodiments, the body 310 is made from a ceramic material, such as aluminum nitride.

One or more channels 304 convey a purge gas through the body 310. The purge gas exits the one or more channels 304 via one or more ports 306, such as three or more ports 306, six or more ports 306, twelve or more ports 306, or sixteen or more ports. It is contemplated that the ports 306 may be shaped and sized to promote an even distribution of purge gas. For example, the ports 306 may be circular or elliptical in cross section. In a further example, some ports 306 may be larger than other ports 306. The ports 306 open into a groove 308 formed between an inner wall 322 of the peripheral portion 316 of the body 310 and the raised band 330. It is contemplated that the groove 308 may have a depth appropriate to promote an even distribution of purge gas. The inner wall 322 of the peripheral portion 316 and groove 308 form a pocket 340 into which the purge gas flows.

As illustrated, the inner wall 322 of the peripheral portion 316 is sloped in a vertical plane. In some embodiments, the inner wall 322 of the peripheral portion 316 includes a curved surface in the vertical plane. In some embodiments, the inner wall 322 of the peripheral portion 316 includes a vertical surface in the vertical plane. In some embodiments, the inner wall 322 of the peripheral portion 316 includes a combination of any two or more of a sloped surface, a curved surface, and a vertical surface in the vertical plane. In an example, the inner wall 322 of the peripheral portion 316 includes both a sloped surface and a curved surface in the vertical plane.

The peripheral portion 316 of the body 310 extends vertically beyond a top surface 155 of the substrate 150 when the substrate is positioned on the raised band 330 of the body 310. When the substrate 150 is being processed, a shadow ring 360 sits on an upper surface 318 of the peripheral portion 316. The shadow ring 360 is removable from the upper surface 318 of the peripheral portion 316 in order to facilitate placement and removal of the substrate 150 onto, and from, the raised band 330. In some embodiments, the shadow ring 360 is made from a ceramic material, such as aluminum oxide or aluminum nitride. The shadow ring 360 is an annular member, and includes a flange 362 that encompasses at least a portion of an outer wall 320 of the peripheral portion 316. In some embodiments, the shadow ring 660 is centered on the body 310. In some embodiments, centering of the shadow ring 360 on the body 310 is facilitated by engagement of one or more protrusions with corresponding receptacle(s). In an example, one or more protrusions on the upper surface 318 of the peripheral portion 316 engage corresponding receptacle(s) in a lower surface 366 of the shadow ring 360. In another example, one or more protrusions on the lower surface 366 of the shadow ring 360 engage corresponding receptacle(s) in the upper surface 318 of the peripheral portion 316.

The shadow ring 360 extends radially inwardly beyond the inner wall 322 of the peripheral portion 316 of the body 310 over the pocket 340. The shadow ring 360 is sized such that a lip 370 is positioned above the edge 154 of the substrate 150 when the substrate 150 is positioned on the raised band 330 of the body 310. In some embodiments, there exists a vertical separation 380 between a bottom surface 372 of the lip 370 and a top surface 155 of the substrate 150. For example, the vertical separation 380 may be 0.001" to 0.02" (0.0254 mm to 0.508 mm), such as 0.002" to 0.015" (0.0508 mm to 0.381 mm), such as 0.005" to 0.015" (0.127 mm to 0.381 mm), such as 0.007" to 0.012" (0.1778 mm to 0.3048 mm).

When the substrate 150 is being processed, the shadow ring 360 directs purge gas from the pocket 340 toward and around the edge 154 of the substrate 150. The flow of purge gas around the edge 154 of the substrate 150 counteracts the tendency of constituents of process gases to migrate toward, and become deposited upon, the edge 154 of the substrate 150. As described above, the effectiveness of the purge gas at mitigating such edge deposition depends at least in part upon the vertical separation 380 of the bottom surface 372 of the lip 370 from the top surface 155 of the substrate 150.

The vertical separation 380 of the bottom surface 372 of the lip 370 from the top surface 155 of the substrate is determined at least in part by the dimensional tolerances of the components. In an example, dimensional tolerances apply to: (i) the vertical stack up from the upper surface 318 of the peripheral portion 316 of the body 310 to the raised band 330; (ii) the vertical stack up from the lower surface 366 of the shadow ring 360 to the bottom surface 372 of the lip 370; and (iii) the thickness of the substrate 150.

It is noted that with substrate support 300, the purge ring 250 present in substrate support 200 is eliminated. Hence, with substrate support 300, there are fewer dimensional tolerances that affect the vertical separation 380 of the bottom surface 372 of the lip 370 from the top surface 155 of the substrate 150 than with substrate support 200. Thus, across processing chambers incorporating substrate support 300, there can be greater uniformity of the vertical separation 380 of the bottom surface 372 of the lip 370 from the top surface 155 of the substrate 150 than across processing chambers incorporating substrate support 200.

Therefore, the yield and quality of processed substrates 150 is more uniform between processing chambers incorporating substrate support 300 than with processing chambers incorporating substrate support 200. Consequently, procedures involving the simultaneous operation of processing chambers incorporating substrate support 300 can be less complex, faster, and cheaper than procedures involving the simultaneous operation of processing chambers incorporating substrate support 200.

In some embodiments, when the substrate 150 is positioned on the raised band 330 of the body 310, and the shadow ring 360 is positioned on the upper surface 318 of the peripheral portion 316, the lip 370 overlaps the substrate 150 such that there exists a lateral distance 382 between the inner edge 374 of the lip 370 and the edge 154 of the substrate 150. For example, the lateral distance 382 between the inner edge 374 of the lip 370 and the edge 154 of the substrate 150 may be 0.001" to 0.1" (0.0254 mm to 2.54 mm), such as 0.02" to 0.09" (0.508 mm to 2.286 mm), such as 0.04" to 0.08" (1.016 mm to 2.032 mm), such as 0.05" to 0.07" (1.27 mm to 1.778 mm).

In some embodiments, when the substrate 150 is positioned on the raised band 330 of the body 310, and the shadow ring 360 is positioned on the upper surface 318 of the peripheral portion 316, the lateral distance 382 between the inner edge 374 of the lip 370 and the edge 154 of the substrate 150 is zero. In some embodiments, when the substrate 150 is positioned on the raised band 330 of the body 310, and the shadow ring 360 is positioned on the upper surface 318 of the peripheral portion 316, the lip 370 does not overlap the substrate 150.

Concentricity of the shadow ring 360 and the substrate 150 relies at least in part upon lateral positioning of the shadow ring 360 with respect to the body 310. Because the purge ring 250 of substrate support 200 is eliminated, with substrate support 300 there are fewer dimensional tolerances that affect the concentricity of the shadow ring 360 and the substrate 150. Thus, across processing chambers incorporating substrate support 300, there can be greater uniformity of the concentricity of the shadow ring 360 and the substrate 150 than across processing chambers incorporating substrate support 200. Therefore, the yield and quality of processed substrates 150 is more uniform between processing chambers incorporating substrate support 300 than with processing chambers incorporating substrate support 200.

In some embodiments, the central portion 312 and the peripheral portion 316 of the body 310 is constructed as a substantially monolithic structure. Thus, heat from heating element 332 in the central portion 312 is readily conducted to the peripheral portion 316. Because the purge ring 250 of substrate support 200 is eliminated and shadow ring 360 is positioned directly on the peripheral portion 316 of the body 310, the shadow ring 360 of substrate support 300 can be heated more effectively than shadow ring 260 of substrate support 200. Hence, in a processing operation in which the substrate 150 is heated to a given temperature, shadow ring 360 of substrate support 300 is heated to a higher temperature than shadow ring 260 of substrate support 200.

Therefore, in operation, the temperature difference between the substrate 150 and the lip 370 of the shadow ring 360 in a chamber incorporating substrate support 300 can be less than the temperature difference between the substrate 150 and the lip 270 of the shadow ring 260 in a chamber incorporating substrate support 200. Thus, detrimental heat transfer between the substrate 150 and shadow ring 260 of substrate support 300 is less than between the substrate 150 and shadow ring 360 of substrate support 200.

Additionally, the heating of the peripheral portion 316 of the body 310 and of the shadow ring 360 mitigates a tendency of the purge gas in the pocket 340 to lose heat. The purge gas in the channel(s) 304 and port(s) 306 is heated by the heating element 332 in the body 310. As the purge gas flows into the pocket 340, the temperature of the purge gas in the pocket 340 depends upon factors such as the residence time of the purge gas in the channel(s) 304 and port(s) 306, the specific heat capacity of the purge gas, and the pressure drop experienced by the purge gas upon entering the pocket 340. In some embodiments, heating of the peripheral portion 316 of the body 310 and of the shadow ring 360 by the conduction of heat from the central portion 312 of the body 310 can result in the peripheral portion 316 and/or the shadow ring 360 being at a temperature that is equal to or slightly lower than the temperature of the purge gas in the pocket 340. For example, the temperature of the peripheral portion 316 or the shadow ring 360 can be 10° F. (5.56° C.) lower, 5° F. (2.78° C.) lower, 2° F. (1.11° C.) lower, or less than 2° F. (1.11° C.) lower than the temperature of the purge gas in the pocket 340. Such small temperature differences mitigate a tendency for the purge gas in the pocket 340 to lose heat to the peripheral portion 316 and/or the shadow ring 360.

In some embodiments, heating of the peripheral portion 316 of the body 310 and of the shadow ring 360 by the conduction of heat from the central portion 312 of the body 310 can result in the peripheral portion 316 and/or the shadow ring 360 being at a temperature that is higher than the temperature of the purge gas in the pocket 340. In some of such embodiments, a temperature of purge gas within the pocket 340 is maintained at least in part by heat transfer from the peripheral portion 316. In some of such embodiments, a temperature of purge gas within the pocket 340 is maintained at least in part by heat transfer from the shadow ring 360.

By mitigating a tendency of the purge gas in the pocket 340 to lose heat as described above, when the purge gas flows between the lip 370 of the shadow ring 360 and the substrate 150, a tendency for the purge gas to cool the outer region 152 of the substrate 150 is alleviated. Consequently, when processed on substrate support 300, the substrate 150 experiences a lower temperature gradient from a central region 151 to the edge 154 than when processed on substrate support 200. Hence, when processed on substrate support 300, the substrate 150 receives a more even deposition of substances than when processed on substrate support 200.

In some embodiments, as described above, the lip 370 of the shadow ring 360 is heated to a temperature less than a temperature of the substrate 150.

In some embodiments, the lip 370 of the shadow ring 360 is heated to a temperature approximately equal to a temperature of the substrate 150, such as within 10° F. (5.56° C.), within 5° F. (2.78° C.), within 2° F. (1.11° C.), or less. In some embodiments, as described above, the lip 370 of the shadow ring 360 is heated to a temperature greater than a temperature of the substrate 150.

In some embodiments, the peripheral portion 316 of body 310 includes an auxiliary heating element 334. Auxiliary heating element 334 can be used to supplement the heating of the peripheral portion 316 and the heating of the shadow ring 360 to adjust the temperature of the peripheral portion 316 and of the shadow ring 360. The resultant effects of increasing the temperature of the peripheral portion 316 and of the shadow ring 360, described above, enable an operator to tune the uniformity of deposition on the substrate 150 while mitigating deposition at the edge 154 of the substrate 150. In some embodiments, auxiliary heating element 334 may be present, but unused during a particular deposition operation. In some embodiments, auxiliary heating element 334 may be omitted.

In a processing operation, the substrate support 300 promotes an even deposition of substances onto a substrate while mitigating a tendency for detrimental deposition at the edge of the substrate. The substrate support 300 provides improved control of purge gas flow and substrate temperature compared to existing substrate supports. The yield and quality of processed substrates is more uniform between processing chambers incorporating substrate support 300 than with processing chambers incorporating existing substrate supports. The consistency of product quality produced by processing chambers incorporating substrate support 300 is greater than the consistency of product quality produced by processing chambers incorporating existing substrate supports. Procedures involving the simultaneous operation of processing chambers incorporating substrate support 300 can be less complex, faster, and cheaper than procedures involving the simultaneous operation of processing chambers incorporating existing substrate supports.

It is contemplated that elements and features of any one disclosed embodiment may be beneficially incorporated in one or more other embodiments. While the foregoing is directed to embodiments of the present disclosure, other and further embodiments of the disclosure may be devised without departing from the basic scope thereof, and the scope thereof is determined by the claims that follow.

What is claimed is:

1. A substrate support, comprising:

a monolithic body including a central portion bounded by a sloped inner wall of a peripheral portion, the central portion including:

a top surface recessed with respect to the peripheral portion, and extending to the peripheral portion;

an annular band protruding from the top surface, the band configured to receive a substrate thereon;

a plurality of ports that open at the top surface into a groove formed between the band and the sloped inner wall; and a heater, wherein the sloped inner wall is sloped in a vertical plane extending upward and outward from the groove to an upper surface of the peripheral portion.

2. The substrate support of claim 1, wherein the peripheral portion includes an auxiliary heater.

3. The substrate support of claim 1, further comprising a shadow ring configured to sit directly upon an upper surface of the peripheral portion.

4. The substrate support of claim 3, wherein when the substrate is positioned on the central portion, a lip of the shadow ring overlaps an edge of the substrate.

5. The substrate support of claim 3, wherein the central portion conducts heat from the heater to the peripheral portion, and the peripheral portion conducts heat directly to the shadow ring.

6. The substrate support of claim 1, wherein the body further includes a purge gas channel connected to the plurality of ports.

7. The substrate support of claim 1, wherein the groove and the inner wall of the peripheral portion form a pocket.

8. The substrate support of claim 7, further comprising a shadow ring configured to sit directly upon an upper surface of the peripheral portion and extend over the pocket.

9. The substrate support of claim 8, wherein:

the heater is positioned to heat the central portion and the peripheral portion.

10. The substrate support of claim 9, wherein a temperature of purge gas within the pocket is maintained at least in part by heat transfer from the peripheral portion.

11. The substrate support of claim 9, wherein heat is transferred from the peripheral portion to the shadow ring.

12. The substrate support of claim 11, wherein a temperature of purge gas within the pocket is maintained at least in part by heat transfer from the shadow ring.

13. The substrate support of claim 12, wherein when the substrate is positioned on the central portion, a temperature of a lip of the shadow ring is approximately equal to a temperature of the substrate.

14. The substrate support of claim 13, wherein the temperature of the lip of the shadow ring is within 5° F. of the temperature of the substrate.

15. A substrate support, comprising:

a monolithic body including a central portion bounded by a sloped inner wall of a peripheral portion, the central portion including:

a top surface recessed with respect to the peripheral portion, extending to the inner wall of the peripheral portion, and including a raised band;

a plurality of ports that open at the top surface into a groove formed between the raised band and the sloped inner wall, the plurality of ports positioned to direct a purge gas towards an underside of a substrate disposed on the band; and a heater, wherein the inner wall is sloped in a vertical plane extending upward and outward from the groove to an upper surface of the peripheral portion; and a shadow ring positioned directly upon an upper surface of the peripheral portion.

16. The substrate support of claim 15, wherein the central portion conducts heat from the heater to the peripheral portion, and the peripheral portion conducts heat directly to the shadow ring.

17. The substrate support of claim 15, wherein the body further includes a purge gas channel connected to the plurality of ports.

18. The substrate support of claim 17, wherein the groove and the inner wall of the peripheral portion form a pocket.

19. The substrate support of claim 18, wherein the shadow ring extends over the pocket.

20. A processing chamber, comprising:

a chamber body; and a substrate support enclosed in a processing volume within the chamber body, the substrate support comprising:

a monolithic body including a central portion bounded by a sloped inner wall of a peripheral portion, the central portion including:

a top surface recessed with respect to the peripheral portion, and extending to the peripheral portion;

an annular band protruding from the top surface, the band configured to receive a substrate thereon;

a plurality of ports that open at the top surface into a groove formed between the band and the sloped inner wall; and a heater, wherein the sloped inner wall is sloped in a vertical plane extending upward and outward from the groove to an upper surface of the peripheral portion; and a shadow ring positioned directly upon an upper surface of the peripheral portion.

* * * * *